(12) United States Patent  
Sunairi (10) Patent No.: US 7,696,793 B2  
(45) Date of Patent: Apr. 13, 2010

(54) DRIVER CIRCUIT AND METHOD FOR DIFFERENTIAL SIGNALING WITH IMPROVED SIGNAL LEVEL CONTROL

(75) Inventor: Souji Sunairi, Kanagawa (JP)

(73) Assignee: NEC Electronics Corporation, Kawasaki, Kanagawa (JP)

( * ) Notice: Subject to any disclaimer, the term of this patent is extended or adjusted under 35 U.S.C. 154(b) by 71 days.

(21) Appl. No.: 11/806,450

(22) Filed: May 31, 2007

(65) Prior Publication Data

US 2007/0279105 A1 Dec. 6, 2007

(30) Foreign Application Priority Data

Jun. 6, 2006 (JP) ............................. 2006-157188

(51) Int. Cl.
*H03B 1/00* (2006.01)

(52) U.S. Cl. .................. 327/108; 327/67; 327/109; 327/543; 326/83; 326/86

(58) Field of Classification Search ......... 327/108–112, 327/65, 67, 538, 543, 563; 326/82, 83, 86, 326/87; 330/258–261

See application file for complete search history.

(56) References Cited

U.S. PATENT DOCUMENTS

| | | | | |
|---|---|---|---|---|
| 5,939,904 A | * | 8/1999 | Fetterman et al. | 327/67 |
| 6,107,882 A | * | 8/2000 | Gabara et al. | 330/253 |
| 6,356,141 B1 | * | 3/2002 | Yamauchi | 327/543 |
| 6,603,348 B1 | * | 8/2003 | Preuss et al. | 327/563 |
| 7,129,756 B2 | | 10/2006 | Omote | 326/115 |
| 7,248,079 B2 | * | 7/2007 | Bhattacharya et al. | 326/83 |
| 2004/0155680 A1 | * | 8/2004 | Icking et al. | 326/83 |

FOREIGN PATENT DOCUMENTS

| | | |
|---|---|---|
| JP | 2005-303830 | 10/2005 |
| JP | 2006-60320 | 3/2006 |
| WO | WO 03/049291 A1 | 6/2003 |

\* cited by examiner

*Primary Examiner*—An T Luu  
(74) *Attorney, Agent, or Firm*—McGinn IP Law Group, PLLC (57) ABSTRACT

A differential signal driver circuit is provided with a driver circuit and a common feedback circuit. The driver circuit is responsive to differential input signals for generating differential output signals from operation currents generated by two current sources. The common feedback circuit controls the current sources to regulate the current levels of the operation currents in response to the differential output signals.

20 Claims, 4 Drawing Sheets

Related Art

US 7,696,793 B2

DRIVER CIRCUIT AND METHOD FOR DIFFERENTIAL SIGNALING WITH IMPROVED SIGNAL LEVEL CONTROL

BACKGROUND OF THE INVENTION

1. Field of the Invention

The present invention relates to a driver circuit and method for differential signaling, more particularly, to differential signaling using reduced amplitude signals.

2. Description of the Related Art

In order to satisfy the requirement of size reduction, recent portable appliances with a LCD (liquid crystal display) panel, such as cell phones and digital cameras, often adopt LVDS (Low Voltage Differential Signaling), which allows transmitting digital signals to a LCD driver with a reduced number of signal lines while reducing EMI (Electromagnetic Interference). The LVDS is a reduced amplitude interface standardized as the TIA/EIA644 standard by TIA/EIA (Telecommunication Industry Association/Electric Industries Alliance).

The LVDS transmission medium, such as a cable and a PCB (printed circuit board) trace, requires termination with an appropriate impedance to form a complete current loop. This requirement does not depend on whether the LVDS transmission medium is a cable or a PCB trace. Inappropriate termination may cause signal interference due to the signal reflection at the end of the cable or the PCB trace; suitable termination is required for reducing undesired electromagnetic wave emission and improving signal quality. In order to avoid signal reflection, the LVDS transmission medium requires a terminating resistor which matches the differential impedance of the cable or the PCB trace. In general, a 100Ω resistor is used as a terminating resistor of an LVDS transmission medium. The terminating resistor is desirably connected between the two signal lines at a position as close as possible to the inputs of the LVDS receiver.

It is important to feed differential signals with stable voltage levels to an LVDS transmission medium. The differential signal amplitude and the output offset voltage (or common mode voltage), which is the average of the voltage levels of the differential signals, are required to be in predetermined ranges. Specifically, the IEEE standard 1596.3-1996 defines allowed variations in the differential signals; for an output offset voltage Vcm of 1.2V, the allowed variation in the differential signals is ±0.075V. There is a need for a technique to provide an LVDS driver that reduces variations in the differential signal amplitude and the output offset voltage.

Figure 4:
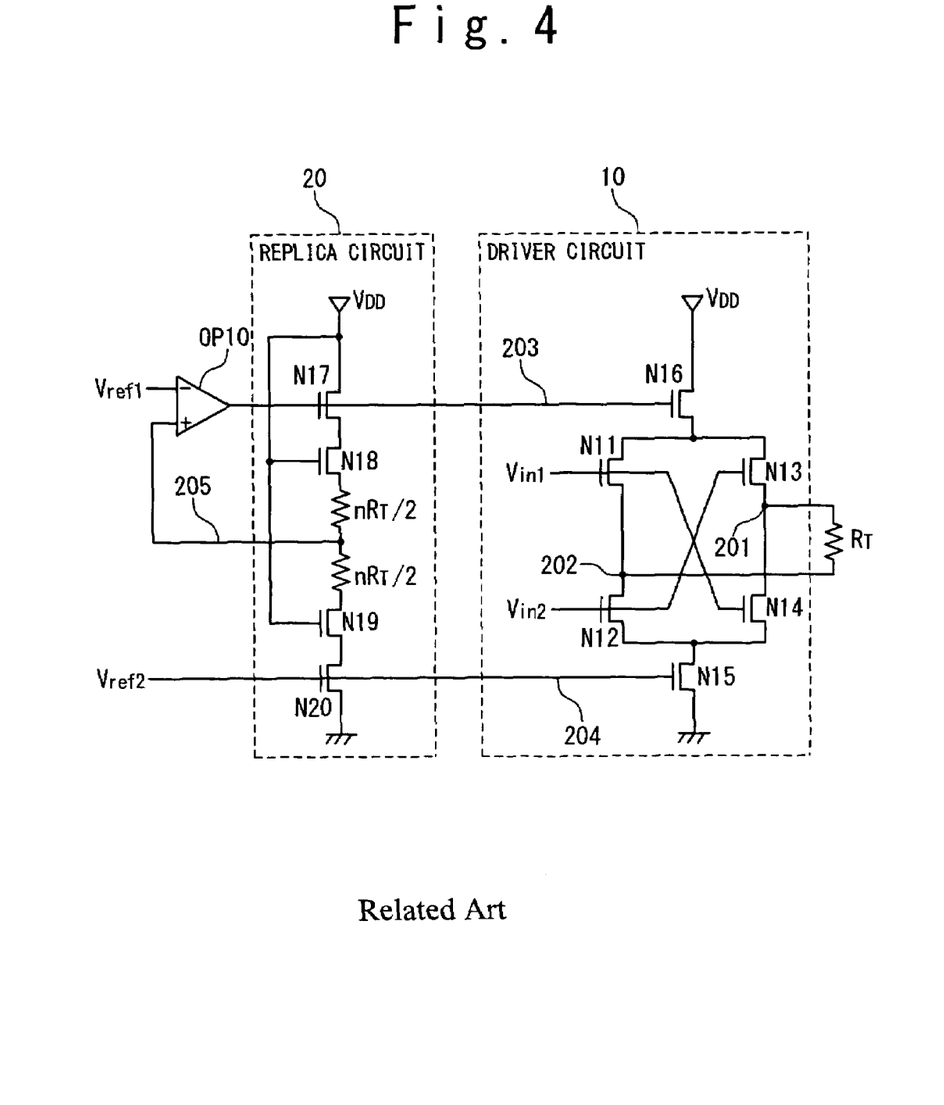
FIG. 4 is a circuit diagram illustrating the configuration of a conventional differential signal driver circuit.

International Publication WO 03/049291 A1 (hereinafter, the '291 international publication) and the corresponding U.S. Pat. No. 7,129,756 disclose a LVDS line driver for generating differential signals with reduced variations. FIG. 4 is a circuit diagram of the disclosed line driver. The line driver shown in FIG. 4 is provided with a driver circuit 10 and a replica circuit 20 for controlling the operation of the driver circuit 10.

The driver circuit 10 includes an output circuit composed of NMOS transistors N11 to N14, and NMOS transistors N15 and N16. The NMOS transistors N11 to N14 each receive a differential signal Vin1 or Vin2 on the gate thereof, and provide switching in response to the received differential signal Vin1 or Vin2. The NMOS transistor N16 is connected between a power line of the power supply level $V_{DD}$ and the drains of the NMOS transistors N11 and N13. The NMOS transistor N15 is connected between a power line of the ground level GND and the sources of the NMOS transistors N12 and N14. A reference voltage Vref2 is supplied to the gate of the NMOS transistor N15 from the output terminal 204 of the replica circuit 20 to control the operating current through the NMOS transistor N15. The gate of the NMOS transistor N16 is connected with the output terminal 203 of the replica circuit 20, and the operation current through the NMOS transistor N15 is controlled depending on the voltage received from the output terminal 203.

The replica circuit 20 is provided with NMOS transistors N17 to N20, and a pair of resistors $nR_T/2$. The size of the NMOS transistors N17 to N20 is 1/n times as large as that of the NMOS transistors N11 to N16. The resistance of the resistors $nR_T/2$ is (n/2) times as large as that of the terminating resistor $R_T$ provided for the receiver. The NMOS transistor N20 of the replica circuit 20 and the NMOS transistor N15 of the driver circuit 10 operate as a current mirror circuit, and the amplitude of the current through the transistor N20 is 1/n times as large as that of the current through the NMOS transistor N15.

The resistors $nR_T/2$ are serially connected with each other on the connection node 205, and function as a replica of the terminating resistor $R_T$. The NMOS transistors N18 and N19, corresponding to the NMOS transistors N11 to N14, are connected with the serially-connected resistors $nR_T/2$. It should be noted that the gates of the NMOS transistors N18 and N19 are kept pulled up to the power supply level $V_{DD}$, and therefore the NMOS transistors N18 and N19 are continuously turned on. The gate of the NMOS transistor N17 is connected with the output terminal of an operation amplifier OP10, and the drain of the NMOS transistor N17 is pulled up to the power supply level $V_{DD}$. A reference voltage Vref1 is fed to the non-inverting input of the operation amplifier OP10, and the inverting input is connected with the connection node 205 of the resistors $nR_T/2$. The operation amplifier OP10 provides feedback control of the voltage level of the output terminal 203 so as to regulate the voltage level of the connection node 205 to the reference voltage Vref1. The operation current through the NMOS transistor N16 is determined by the voltage level of the output terminal 203. Additionally, the drain currents of the NMOS transistors N15 and N20 are controlled by the reference voltage Vref2. In other words, the operation currents of the driver circuit 10 and the replica circuit 20 are controlled depending on the reference voltage Vref2.

The above-described configuration allows controlling the gate voltage of the NMOS transistor N16, which operates as a current source within the driver current 10, so as to reduce the difference between the voltage level of the connection node 205 and the reference voltage Vref1, thereby controlling the voltage applied across the terminating resistor $R_T$.

However, the inventor has recognized that the line driver disclosed in the '291 international publication suffers from large variations in the amplitudes of the differential output signals and the output offset voltage, due to the manufacture variations of the replica circuit 20 and the interface between the driver circuit 10 and the replica circuit 20.

Japanese Laid-Open Patent Applications Nos. JP-A 2005-303830 (hereinafter, the '830 application) and JP-A 2006-60320 (hereinafter, the '320 application) disclose another driver configuration in which two operation amplifiers receiving different reference voltages respectively control two current sources within a driver circuit to thereby reduce the variations in the differential output signals. More specifically, one of the operation amplifiers receives an intermediate voltage which is generated as the average of the voltage levels of the differential output signals and controls one of the two current sources in response to the comparison of the intermediate voltage with the reference voltage. The other of the operation amplifiers is connected with a selector circuit that provides a connection with a selected one of the two output terminals of the driver circuit in response to the voltage level of the input signal fed to the driver circuit. The other operation amplifier controls the other of the current source in response to the comparison of the voltage received from the selected output terminal and the reference voltage. Controlling the two current sources within the driver circuit effectively reduces the variations in the differential output signals.

However, the inventor has recognized that the driver circuits disclosed in the '830 and '320 applications suffers from a problem that it takes long time to stabilize the voltage levels of the differential output signals within a desired range. In the worst case, the differential output signals may settle at voltage levels out of the desired range. The driver circuits disclosed in the '830 and '320 applications uses a selector circuit to select the voltage fed to the operation amplifier that control the current source within the driver circuit. Therefore, the voltage received by the operation amplifier may largely change. This undesirably increases the duration of time necessary for stabilization of the voltage levels of the differential output signals.

SUMMARY

In one embodiment, a differential signal driver circuit is provided with a driver circuit and a common feedback circuit. The driver circuit is responsive to differential input signals for generating differential output signals from operation currents generated by two current sources. The common feedback circuit controls the current sources to regulate the current levels of the operation currents in response to the differential output signals.

In such configuration, the common feedback circuit controls the two current sources, and this allows suppressing changes in the differential output signals in a short time.

BRIEF DESCRIPTION OF THE DRAWINGS

The above and other objects, advantages and features of the present invention will be more apparent from the following description of certain preferred embodiments taken in conjunction with the accompanying drawings, in which.

DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposes. It should be noted that same or similar reference numerals denotes same, similar or equivalent elements in the attached drawings.

First Embodiment (Circuit Configuration)

Figure 1:
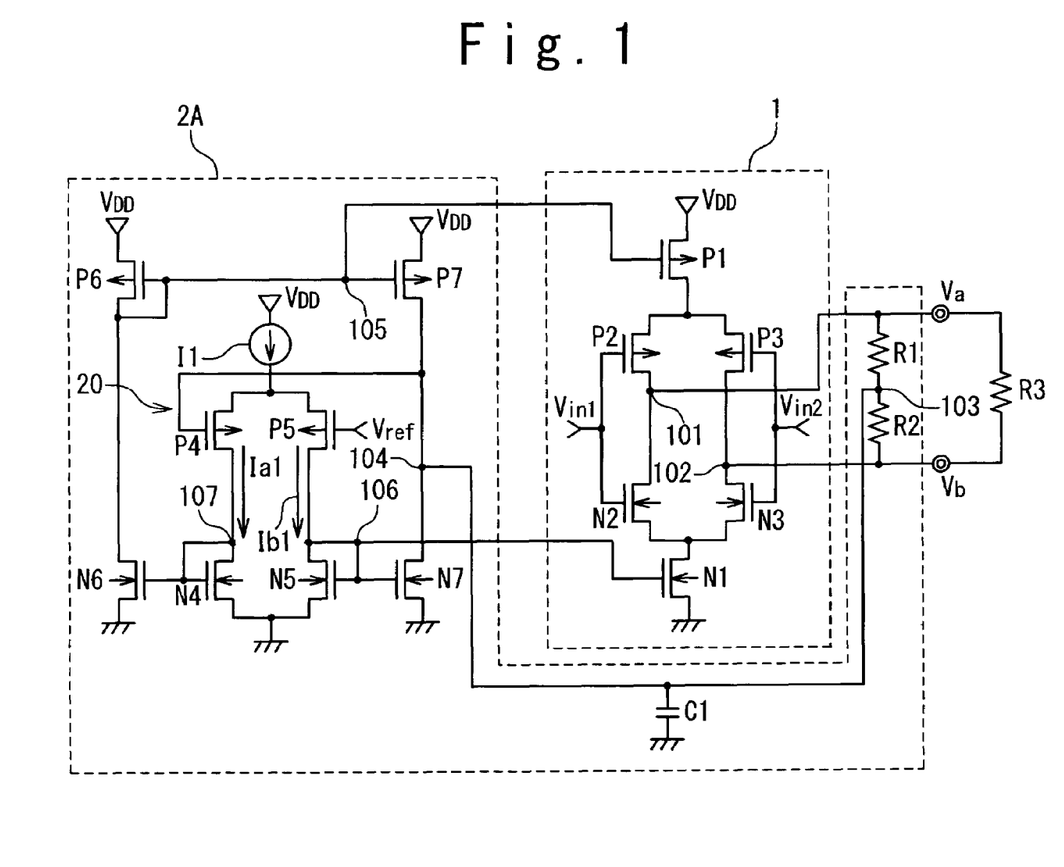
FIG. 1 is a circuit diagram illustrating the configuration of a differential signal driver circuit according to a first embodiment of the present invention.

FIG. 1 is a circuit diagram illustrating the configuration of a differential signal driver circuit according to a first embodiment. The differential signal driver circuit of the first embodiment includes a driver circuit 1 and a common feedback (CMFB) circuit 2A. The driver circuit 1 generates differential output signals Va and Vb to be fed to a terminating resistor R3 connected with a receiver (not shown). The CMFB circuit 2A stabilizes the output offset voltage Vcm (or the common mode voltage) of the differential output signals Va and Vb within a desired range.

The driver circuit 1 is provided with a PMOS transistor P1 to P3, and NMOS transistor N1 to N3. The PMOS transistor P1 is connected with a power line of a power supply level $V_{DD}$ and operates as a first current source. Correspondingly, the NMOS transistor N1 is connected with a power line of a ground level GND and operates as a second current source. It should be noted that the PMOS transistor P1 and the NMOS transistor N1 operate in the saturation region.

The PMOS transistors P2 and P3 and the NMOS transistors N2 and N3 operate as an output circuit outputting the differential output signals Va and Vb from output nodes 101 and 102 to the receiver, in response to differential input signals Vin1 and Vin2. It should be noted that the transmission line used to transmit the differential output signals Va and Vb is terminated by the terminating resistor R3. The PMOS transistor P2 and NMOS transistor N2 receive the differential input signal Vin1, while PMOS transistor P3 and NMOS transistor N3 receive the differential input signal Vin2.

The sources of the PMOS transistors P2 and P3 are commonly connected with the drain of the PMOS transistor P1, and the sources of the NMOS transistors N2 and N3 are commonly connected with the drain of the NMOS transistor N1. The drains of the PMOS transistors P2 and P3 are connected with the drains of the NMOS transistors N2 and N3 through the output nodes 101 and 102, respectively. The gate of the PMOS transistor P1 is connected with an output node 105 of the CMFB circuit 2A, and the gate of the NMOS transistor N1 is connected with an output node 106 of the CMFB circuit 2A.

The CMFB circuit 2A controls the gate voltages of the PMOS transistor P1 and the NMOS transistor N1, which are connected with the output terminals 105 and 106, respectively. The CMFB circuit 2A is provided with a current source I1, a differential amplifier circuit 20, PMOS transistors P6 and P7, NMOS transistors N6 and N7, and a pair of resistors R1 and R2. The differential amplifier circuit 20 is connected between the current source I1 and a power line of the ground level GND. The current source I1 is connected with a power line of the power supply level $V_{DD}$ and feeds an operation current to the differential amplifier circuit 20. The resistors R1 and R2 are connected with each other on the intermediate node 103 and disposed between the output nodes 101 and 102 in parallel to the terminating resistor R3. The resistors R1 and R2 have impedances sufficiently larger than that of the terminating resistor R3. In one embodiment, the terminating resistor R3 has a resistance of 100Ω and the resistors R1 and R2 have an impedance of 100 times or more of the impedance of the terminating resistor R3. Therefore, most of the current from the first current source (the PMOS transistor P1) does not flow through the resistors R1 and R2. Preferably, the resistors R1 and R2 have the same impedance. In this case, the voltage level on the intermediate node 103 is identical to the intermediate voltage of the differential output signals Va and Vb, that is, the output offset voltage Vcm. In an alternative embodiment, other load elements or load circuits having the same impedance may be used in place of the resistors R1 and R2.

The differential amplifier circuit 20 is provided with PMOS transistors P4 and P5 and NMOS transistors N4 and N5.

The PMOS transistors P4 and P5 operate as an input stage receiving the output offset voltage Vcm and a reference voltage Vref. The gate of the PMOS transistor P4 is connected with the intermediate node 103 through an input node 104, and the gate of the PMOS transistor P5 is connected with an external reference voltage generator circuit (not shown) to receive the reference voltage Vref. The sources of the PMOS transistors P4 and P5 are commonly connected with the current source I1.

It is preferable that the reference voltage generator circuit feeding the reference voltage Vref to the PMOS transistor P5 is composed of a band gap regulator, which generates a substantially constant voltage stably against manufacture variations and changes in the power supply voltage and the operation temperature. The use of a band gap regulator is especially effective for supporting an interface standard requesting severe allowed variations in the differential output signals (such as, an interface standard used for image data transmission to the LCD driver within the cell phone).

The NMOS transistors N4 and N5 are diode-connected to operate as active loads that determines the gain of the differential amplifier circuit 20. Specifically, the gates of the NMOS transistors N4 and N5 are connected with the drains thereof. The sources of the NMOS transistors N4 and N5 are commonly connected with a power line of the ground level GND. The drains of the NMOS transistors N4 and N5 are connected with the drains of the PMOS transistors P4 and P5 through output nodes 10.

The gate of the NMOS transistor N5 is connected with the gate of the NMOS transistor N7, and is also connected with the gate of the NMOS transistor N1 through an output node 105. Such connections allow the NMOS transistors N1, N5 and N7 to function as a two-output current mirror. The drain of the NMOS transistor N7 is connected with a power line of the power supply level $V_{DD}$ through the input node 104 and the PMOS transistor P7, and the source of the NMOS transistor N7 is connected with a power line of the ground level GND.

On the other hand, the gate of the NMOS transistor N4 is connected with the gate of the NMOS transistor N6. Such connected allows the NMOS transistors N4 and N6 to function as a current mirror. The NMOS transistor N6 has a drain connected with the drain of the PMOS transistor P6 and a source connected with a power line of the ground level GND.

The gate of the PMOS transistor P6 is connected with the drain thereof, and is also connected with the gates of the PMOS transistors P1 and P7. Such connections allow the PMOS transistors P1, P6 and P7 to function as a two-output current mirror. The source of the PMOS transistor P6 is connected with a power line of the power supply level $V_{DD}$. The PMOS transistor P7 has a source connected with a power line of the power supply level $V_{DD}$ and a drain connected with the drain of the NMOS transistor N7, the gate of the PMOS transistor P4, and the intermediate node 103.

Preferably, a phase compensation capacitor C1 is connected with a feedback interconnection provided between the intermediate node 103 and the input node 104. The phase compensation capacitor C1 is connected between the feedback interconnection and a power line of the ground level GND. The phase compensation capacitor C1 avoids the oscillation of the differential output signals Va and Vb, adjusting the gain-frequency characteristics of the driver circuit 1 and the differential amplifier circuit 20 within the CMFB circuit 2A, and controlling the phase of a feedback signal transmitted from the intermediate node 103 to the differential amplifier circuit 20. Additionally, the phase compensation capacitor C1 absorbs changes in the output offset voltage Vcm and thereby suppresses short-time changes in the differential output signals Va and Vb.

The CMFB circuit 2A thus structured compares the output offset voltage Vcm (or the intermediate voltage) with the reference voltage Vref, and feeds control voltages to the gates of the PMOS transistor P1 and the NMOS transistor N1 in response to the comparison result. It should be noted that the PMOS transistor P1 and the NMOS transistor N1 function as the power-side and ground-side current sources, respectively. This allows controlling the operation currents of the driver circuit 1. The driver circuit 1 generates the differential output signals Va and Vb from the operation currents controlled by the CMFB circuit 2A. As thus described, the differential signal driver circuit of the first embodiment is designed to generate the differential output signals Va and Vb so that the output offset voltage Vcm is controlled in a given allowed range.

Additionally, the configuration of the differential signal driver circuit of the first embodiment effectively reduces the manufacture cost. The circuits disclosed in the '291 international publication and the '830 and '320 applications, which include a replica circuit or a selector circuit selecting the feedback signal fed to operation amplifier that controls the current source, suffer from large circuit size. On the contrary, the differential signal driver circuit of the first embodiment only includes the CMFB circuit 2A composed of eight MOS transistors and two resistors in addition to the driver circuit 1, and effectively reduces the circuit size.

It should be noted that the CMFB circuit 2A, which uses only one reference voltage Vref to control the operation currents within the driver 1, requires only one reference voltage generator circuit. This is also advantageous for the circuit size reduction compared with the circuit configurations disclosed in the '291 international publication and the '830 and '320 applications, especially when a band gap regulator is used as the reference voltage generator circuit to thereby improve the accuracy of the differential output signals. Although a band gap regulator has a large circuit size, the configuration of the differential signal driver circuit of the first embodiment, which requires only one reference voltage generator circuit, allows incorporating a band gap regulator with a minimum increase in the circuit size.

(Operation)

Figure 2A:
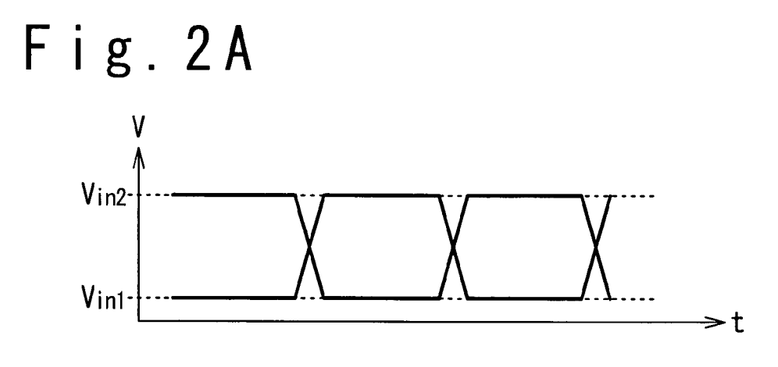
FIG. 2A illustrates waveforms of differential input signals.
Figure 2B:
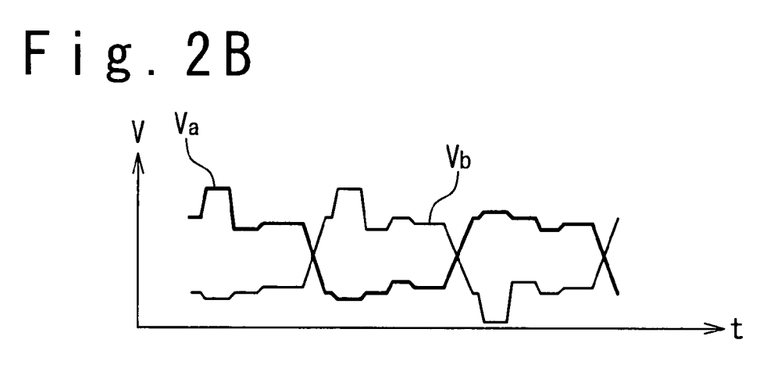
FIG. 2B illustrates waveforms of differential output signals.
Figure 2C:
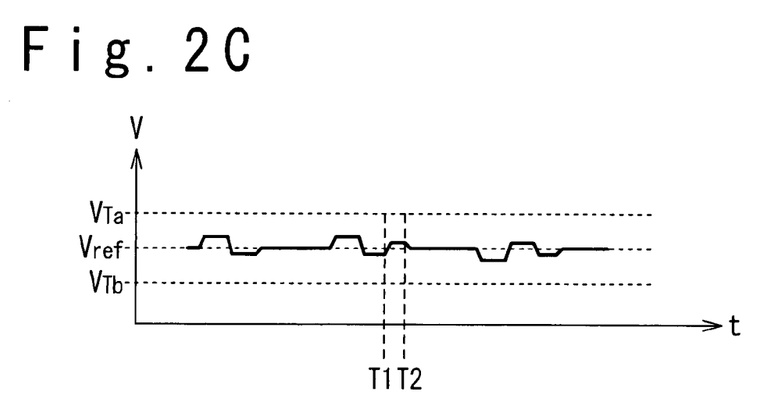
FIG. 2C illustrates a waveform of an output offset voltage.

In the following, the operation of the differential signal driver circuit of the first embodiment is described below in detail with reference to FIGS. 1, and 2A to 2C. FIG. 2A illustrates the waveforms of the differential input signals Vin1 and Vin2, FIG. 2B illustrates the waveforms of the differential output signals Va and Vb, and FIG. 2C illustrates the waveform of the output offset voltage Vcm.

The driver circuit 1 outputs the differential output signals Va and Vb in response to the differential input signals Vin1 and Vin2. The differential output signals Va and Vb are controlled by the CMFB circuit 2A so that the output offset voltage Vcm is controlled around the reference voltage Vref in a predetermined range from Vtb to Vta. For the case when the reference voltage Vref is set to 1.2V, for example, the lower limit Vtb is 1.125 V (=1.2−0.075 V), and the upper limit Vta is 1.275 V (=1.2+0.075 V).

In the following, a detailed description is made of the circuit operation during the period between the times T1 and T2 shown in FIG. 2C. Hereinafter, the current flowing from the drain of the PMOS transistor P4 to the source of the NMOS transistor N4 is referred to as the current Ia1, and the current flowing from the drain of the PMOS transistor P5 to the source of the NMOS transistor N5 is referred to as the current Ib1.

At the time T1, the output offset voltage Vcm is lower than the reference voltage Vref. This leads to that the gate voltage of the PMOS transistor P4 is lower than that of the PMOS transistor P5 and the current Ia1 is increased to exceed the current Ib1. This causes the increases in the gate voltages of the NMOS transistors N4 and N6 and the decreases in the gate voltages of the PMOS transistors P6 and P1. Additionally, the gate voltages of the NMOS transistors N5, N7 and N1 are decreased. The decreases in the gate voltages of the PMOS transistor P1 and the NMOS transistor N1 result in the increase in the current through the PMOS transistor P1 (the first current source) and the decrease in the current through the NMOS transistor N1 (the second current source). Therefore, the voltage levels of the differential output signals Vb and Va are increased, and therefore the output offset voltage Vcm is also increased toward the reference voltage Vref.

At the time T2, on the other hand, the output offset voltage Vcm is higher than the reference voltage Vref. This leads to that the gate voltage of the PMOS transistor P4 is higher than that of the PMOS transistor P5 and the current Ia1 is decreased below the current Ib1. This causes the decreases in the gate voltages of the NMOS transistors N4 and N6 and the increases in the gate voltages of the PMOS transistors P6 and P1. Additionally, the gate voltages of the NMOS transistors N5, N7 and N1 are increased. The increases in the gate voltages of the PMOS transistor P1 and the NMOS transistor N1 result in the decrease in the current through the PMOS transistor P1 (the first current source) and the increase in the current through the NMOS transistor N1 (the second current source). Therefore, the voltage levels of the differential output signals Vb and Va are decreased, and therefore the output offset voltage Vcm is also decreased toward the reference voltage Vref.

As thus described, the CMFB circuit 2A performs feedback control based on the output offset voltage Vcm to control the first and second current sources generating the operation currents of the driver circuit 1, and thereby regulates the output offset voltage Vcm to the reference voltage Vref. Accordingly, the differential signal driver circuit of the first embodiment effectively suppresses the changes in the differential output signals in a short time compared to the conventional circuits that control only one of the current sources, since the CMFB circuit 2A controls both of the power-side and ground-side current sources (that is, first and second current sources).

The differential signal driver circuit of the first embodiment has an additional advantage that the differential output signals Va and Vb can be stabilized with a desired accuracy through optimization of the dimensions of the MOS transistors, since the gate voltages of the current sources are controlled by current mirrors composed of MOS transistors.

Second Embodiment (Circuit Configuration)

Figure 3:
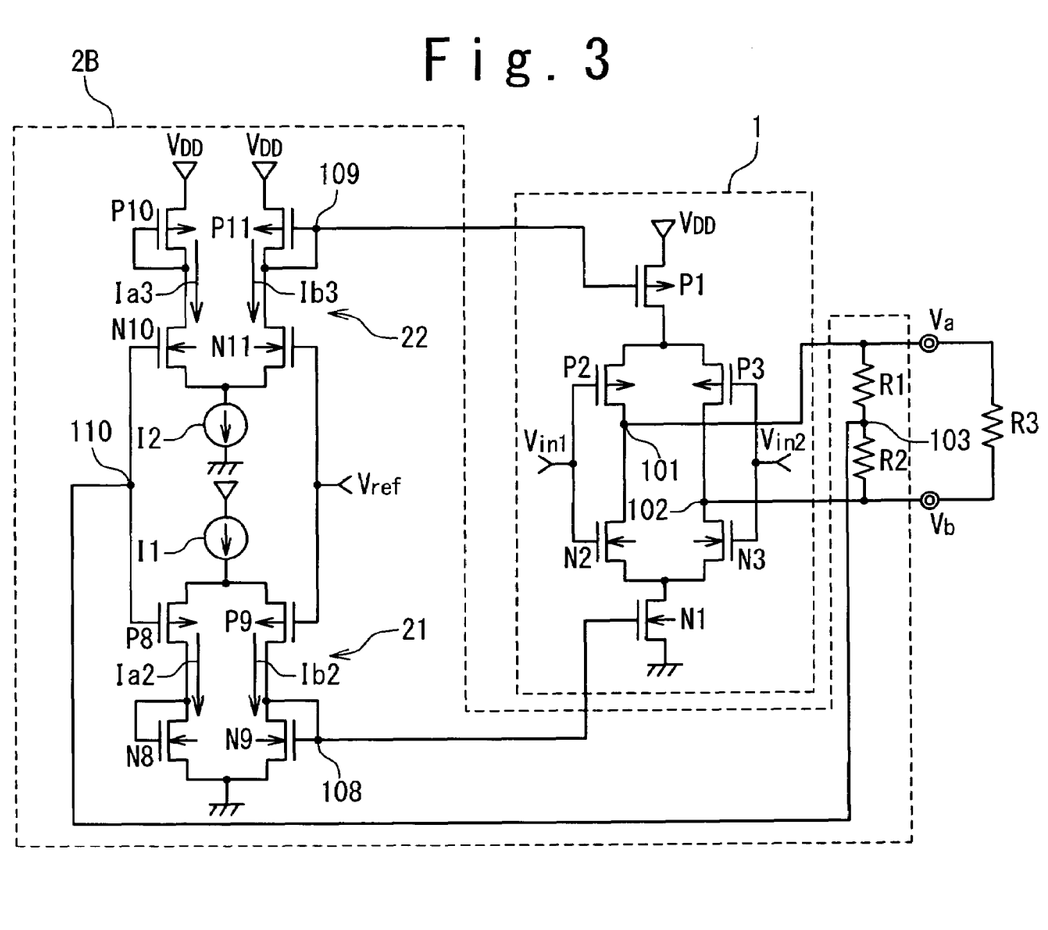
FIG. 3 is a circuit diagram illustrating the configuration of a differential signal driver circuit according to a second embodiment of the present invention.

FIG. 3 illustrates the configuration of a differential signal driver circuit according to a second embodiment. The configuration of the differential signal driver circuit of the second embodiment is similar to that of the first embodiment, except for that a CMFB circuit 2B is incorporated in place of the CMFB circuit 2A.

The structure of the driver circuit 1 in the second embodiment is identical to that of the first embodiment. The gate of the PMOS transistor P1, which operates as the first current source, is connected with an output node 109 of the CMFB circuit 2B, and the gate of the NMOS transistor N1, which operates as the second current source, is connected with an output node 108 of the CMFB circuit 2B.

The CMFB circuit 2B includes differential amplifier circuits 21 and 22 having input stages composed of MOS transistors of different conductivity types, and a pair of resistors R1 and R2 connected between the output nodes 101 and 102 of the driver circuit 1. The differential amplifier circuit 21 includes an input stage composed of PMOS transistors, and controls the gate voltage of the NMOS transistor N1 through the output node 108. The differential amplifier circuit 22 includes an input stage composed of NMOS transistors, and controls the gate voltage of the PMOS transistor P1 through the output node 109.

More specifically, the differential amplifier circuit 21 includes PMOS transistors P8 and P9 and NMOS transistors N8 and N9. The PMOS transistors P8 and P9 operate as an input stage. Specifically, the sources of the PMOS transistors P8 and P9 are commonly-connected with a current source I1. The gate of the PMOS transistor P8 is connected with the intermediate node 103 through an input node 110 to receive the output offset voltage Vcm. The gate of the PMOS transistor P9 receives a reference voltage Vref from a reference voltage generator circuit (not shown). The drain of the PMOS transistor P8 is connected with the drain of the NMOS transistor N8, and the drain of the PMOS transistor P9 is connected with the drain of the NMOS transistor N9.

The NMOS transistors N8 and N9 operate as active loads. The gates of the NMOS transistors N8 and N9 are connected with the drains thereof, respectively. Additionally, the gate of the NMOS transistor N9 is connected with the gate of the NMOS transistor N1 through the output node 108, and therefore the NMOS transistors N1 and N9 operate as a current mirror. As a result, the differential amplifier circuit 21 controls the gate voltage of the NMOS transistor N1, which operate as the second current source, in response to the output offset voltage Vcm and the reference voltage Vref.

On the other hand, the differential amplifier circuit 21 includes NMOS transistors N10 and N11 and PMOS transistors P10 and P11. The NMOS transistors N10 and N11 operate as an input stage. Specifically, the sources of the NMOS transistors N10 and N11 are commonly-connected with a current source I2. The gate of the NMOS transistor N10 is connected with the intermediate node 103 through the input node 110 to receive the output offset voltage Vcm. The gate of the NMOS transistor N11 receives the reference voltage Vref from the reference voltage generator circuit (not shown). The drain of the NMOS transistor N10 is connected with the drain of the PMOS transistor P10, and the drain of the NMOS transistor N11 is connected with the drain of the PMOS transistor P11.

The PMOS transistors P10 and P11 operate as active loads. The gates of the PMOS transistors P10 and P11 are connected with the drains thereof, respectively. Additionally, the gate of the PMOS transistor P11 is connected with the gate of the NMOS transistor P1 through the output node 109, and therefore the PMOS transistors P1 and P11 operate as a current mirror. As a result, the differential amplifier circuit 22 controls the gate voltage of the PMOS transistor P1, which operate as the first current source, in response to the output offset voltage Vcm and the reference voltage Vref.

(Operation)

In the following, the operation of the differential signal driver circuit of the first embodiment is described below in detail with reference to FIGS. 2A to 2C and 3. As shown in FIGS. 2A and 2B, the driver circuit 1 outputs the differential output signals Va and Vb in response to the differential input signals Vin1 and Vin2. The differential output signals Va and Vb are controlled by the CMFB circuit 2A so that the output offset voltage Vcm is controlled around the reference voltage Vref in a predetermined range from Vtb to Vta, as shown in FIG. 2C. For the case when the reference voltage Vref is set to 1.2V, for example, the lower limit Vtb is 1.125 V (=1.2−0.075 V), and the upper limit Vta is 1.275 V (=1.2+0.075 V).

In the following, a detailed description is made of the circuit operation during the period between the times T1 and T2 shown in FIG. 2C. Hereinafter, the current flowing from the drain of the PMOS transistor P8 to the source of the NMOS transistor N8 is referred to as the current Ia2, and the current flowing from the drain of the PMOS transistor P9 to the source of the NMOS transistor N9 is referred to as the current Ib2. Correspondingly, the current flowing from the drain of the PMOS transistor P10 to the source of the NMOS transistor N10 is referred to as the current Ia3, and the current flowing from the drain of the PMOS transistor P11 to the source of the NMOS transistor N11 is referred to as the current Ib3.

At the time T1, the output offset voltage Vcm is lower than the reference voltage Vref. This leads to that the gate voltage of the PMOS transistor P8 is decreased below that of the PMOS transistor P9 and the current Ia2 is increased to exceed the current Ib2. This causes a decrease in the gate voltages of the NMOS transistors N1 and N9. Correspondingly, the gate voltage of the NMOS transistor N10 is decreased below that of the NMOS transistor N11 and the current Ia3 is decreased below the current Ib3. This causes a decrease in the gate voltages of the PMOS transistors P1 and P11. The decrease in the gate voltages of the PMOS transistor P1 and the NMOS transistor N1 causes an increase in the current through the PMOS transistor P1 (the first current source), and a decrease in the current through the NMOS transistor N1 (the second current source). Therefore, the voltage levels of the differential output signals Va and Vb are increased, and the output offset voltage Vcm is also increased toward the reference voltage Vref.

At the time T2, on the other hand, the output offset voltage Vcm is higher than the reference voltage Vref. This leads to that the gate voltage of the PMOS transistor P8 is increased above that of the PMOS transistor P9 and the current Ia2 is decreased below the current Ib2. This causes an increase in the gate voltages of the NMOS transistors N1 and N9. Correspondingly, the gate voltage of the NMOS transistor N10 is increased above that of the NMOS transistor N11 and the current Ia3 is increased above the current Ib3. This causes an increase in the gate voltages of the PMOS transistors P1 and P11. The increase in the gate voltages of the PMOS transistor P1 and the NMOS transistor N1 causes a decrease in the current through the PMOS transistor P1 (the first current source), and an increase in the current through the NMOS transistor N1 (the second current source). Therefore, the voltage levels of the differential output signals Va and Vb are decreased, and the output offset voltage Vcm is also decreased toward the reference voltage Vref.

As thus described, the CMFB circuit 2B performs feedback control based on the output offset voltage Vcm to control the first and second current sources generating the operation currents of the driver circuit 1, and thereby regulates the output offset voltage Vcm to the reference voltage Vref. Accordingly, the differential signal driver circuit of the second embodiment effectively suppresses the changes in the differential output signals in a short time compared to the conventional circuits that control only one of the current sources, since the CMFB circuit 2A controls both of the power-side and ground-side current sources (that is, first and second current sources).

The differential signal driver circuit of the second embodiment has another advantage that the differential output signals Va and Vb can be stabilized with a desired accuracy through optimization of the dimensions of the MOS transistors, since the gate voltages of the current sources are controlled by current mirrors composed of MOS transistors.

The differential signal driver circuit of the second embodiment has still another advantage that it deals with wide-range changes in the output offset voltage Vcm. In the second embodiment, the input stages of the differential amplifier circuits 21 and 22 are composed of MOS transistors of different conductivity types. Therefore, when the output offset voltage Vcm is increased up to around the power supply level $V_{DD}$ and thereby the PMOS transistor P8 is turned off, for example, the differential amplifier circuit 22, including the NMOS input stage, operates to control the operation currents of the driver circuit 1.

As thus described, the differential signal driver circuit of the above-described embodiments controls the current sources within the driver circuit 1 on the basis of the feedback of the intermediate voltage (the output offset voltage Vcm) of the differential output signals Va and Vb, without using a replica circuit. Therefore, the differential signal driver circuit of the above-described embodiments effectively avoids undesired variations in the differential output signals Va and Vb resulting from manufacture variations in the replica circuit and the interface between the replica circuit and the driver circuit. Accordingly, the differential signal driver circuit of the above-described embodiments can regulate the output offset voltage Vcm within an allowed range defined in a strict standard (such as, a standard used for data transfer to the LCD driver of the cell phone).

Additionally, the differential signal driver circuit of the above-described embodiments, which provides feedback of the difference between the output offset voltage Vcm and the reference voltage Vref for both of the first and second current sources (that is, the PMOS transistor P1 and the NMOS transistor N1) effectively reduces the changes in the gate voltages of the respective current sources, and thereby reduces the changes in the operation currents of the driver circuit 1. This allows reducing changes in the output offset voltage Vcm while regulating the output offset voltage Vcm to the reference voltage Vref in a short time.

It is apparent that the present invention is not limited to the above embodiments, but may be modified and changed without departing from the scope of the invention.

What is claimed is:

1. A differential signal driver circuit, comprising:
 a driver circuit responsive to differential input signals for generating differential output signals from operation currents fed from two current sources; and
 a common feedback circuit controlling said two current sources to regulate current levels of said operation currents in response to said differential output signals by outputting an intermediate voltage of said differential output signals directly to drains of at least two transistors in the common feedback circuit.

2. The differential signal driver circuit according to claim 1, wherein said common feedback circuit is configured to generate the intermediate voltage of said differential output signals and to provide feedback control for said two current sources in response to comparison between said intermediate voltage and a given reference voltage.

3. The differential signal driver circuit according to claim 2, wherein said common feedback circuit includes:
an input stage receiving said intermediate voltage and said reference voltage; and
active loads connected with said input stage,
wherein said active loads control said two current sources in response to said intermediate voltage and said reference voltage.

4. The differential signal driver circuit according to claim 3, wherein said two current sources includes:
a first current source comprising a first transistor of a first conductivity type; and
a second current source comprising a second transistor of a second conductivity type different from said first conductivity type,
said active loads including:
a first active load controlling a gate voltage of said first transistor in response to said intermediate voltage and said reference voltage; and
a second active load controlling a gate voltage of said second transistor in response to said intermediate voltage and said reference voltage.

5. The differential signal driver circuit according to claim 4, wherein said second active load comprises a third transistor of said second conductivity type, and
wherein said second and third transistors operate as a current mirror.

6. The differential signal driver circuit according to claim 5, wherein said first active load comprises a fourth transistor of said second conductivity type,
wherein said input stage comprises:
a fifth transistor of said first conductivity type connected with said fourth transistor, said fifth transistor receiving said intermediate voltage on a gate thereof through an input node; and
a sixth transistor of said first conductivity type connected with said third transistor through said second output node, said sixth transistor receiving said reference voltage on a gate thereof,
wherein said common feedback circuit further includes:
seventh and eighth transistors of said first conductivity type, said first, seventh and eighth transistors operating as a current mirror;
a ninth transistor of said second conductivity type, gates of said fourth and ninth transistors being commonly connected to operate said fourth and ninth transistors as a current mirror; and
a tenth transistor of said second conductivity type, gates of said third and tenth transistors being commonly connected to operate said second, third and tenth transistors as a current mirror, and
wherein said seventh transistor is connected with said ninth transistor and said eighth transistor is connected with said tenth transistor through said input node.

7. The differential signal driver circuit according to claim 6, wherein said common feedback circuit further includes a phase compensation capacitor connected with said input node.

8. The differential signal driver circuit according to claim 2, wherein said two current sources includes:
a first current source comprising a first transistor of a first conductivity type; and
a second current source comprising a second transistor of a second conductivity type different from said first conductivity type,
wherein said common feedback circuit includes:
a first differential amplifier circuit comprising a first active load and a first input stage receiving said intermediate voltage and said reference voltage; and
a second differential amplifier circuit comprising a second active load and a second input stage receiving said intermediate voltage and said reference voltage, and
wherein said first active load is connected with said first input stage, and controls a gate voltage of said first transistor in response to said intermediate voltage and said reference voltage, and said second active load is connected with said second input stage, and controls a gate voltage of said second transistor in response to said intermediate voltage and said reference voltage.

9. The differential signal driver circuit according to claim 8, wherein said first input stage comprises:
a third transistor of said second conductivity type receiving said intermediate voltage on a gate thereof and
a fourth transistor of said second conductivity type receiving said reference voltage on a gate thereof,
wherein said first active load comprises a fifth transistor connected with said fourth transistor, said first and fifth transistor operating as a current mirror, and
wherein said second input stage comprises:
sixth transistor of said first conductivity type receiving said intermediate voltage on a gate thereof; and
a seventh transistor of said first conductivity type receiving said reference voltage on a gate thereof,
wherein said second active load comprises an eighth transistor connected with said seventh transistor, said second and eighth transistor operating as a current mirror.

10. A method of operating a differential signal driver circuit comprising:
generating, in response to differential input signals, differential output signals from operation currents generated by two current sources; and
controlling said two current sources to regulate current levels of said operation currents in response to said differential output signals by outputting an intermediate voltage of said differential output signals directly to drains of at least two transistors.

11. The method according to claim 10, wherein said controlling said two current sources includes:
generating an intermediate voltage of said differential output signals; and
providing feedback control for said two current sources in response to said intermediate voltage and a given reference voltage.

12. The method according to claim 11, wherein said providing feedback control comprises:
feeding said intermediate voltage to a differential amplifier circuit;
controlling currents through active loads that determine a gain of said differential amplifier circuit, in response to said intermediate voltage and said reference voltage; and
controlling said two current sources in response to said intermediate voltage and said reference voltage through controlling said currents through said active loads.

13. The method according to claim 12, wherein said two current sources includes:
a first current source comprising a first transistor of a first conductivity type; and a second current source comprising a second transistor of a second conductivity type different from said first conductivity type, wherein said gate voltages of said first and second transistors are controlled in response to said intermediate voltage and said reference voltage.

14. The method according to claim 11, wherein said two current sources includes first and second current sources, wherein said providing feedback control comprises:

feeding said intermediate voltage to first and second differential amplifier circuits, said first differential amplifier circuit including an input stage composed of transistors of a first conductivity type, and said second differential amplifier circuit including an input stage composed of transistors of a second conductivity type different from said first conductivity type;

controlling said first current source in response to said intermediate voltage and said reference voltage by said first differential amplifier circuit; and controlling said second current source in response to said intermediate voltage and said reference voltage by said second differential amplifier circuit.

15. The differential signal driver circuit according to claim 1, wherein a first transistor of a first conductivity type, a second transistor of the first conductivity type, and a third transistor of a second conductivity type, different from said first conductivity type, receive said intermediate voltage of said differential output signals.

16. The differential signal driver circuit according to claim 15, wherein a gate of the first transistor, a drain of the second transistor, and a drain of the third transistor receive said intermediate voltage of said differential output signals.

17. The differential signal driver circuit according to claim 1, wherein a first transistor of a first conductivity type and a second transistor of a second conductivity type, different from said first conductivity type, receive said intermediate voltage of said differential output signals.

18. The differential signal driver circuit according to claim 17, wherein a gate of the first transistor and a gate of said second transistor receive said intermediate voltage of said differential output signals.

19. The differential signal driver circuit according to claim 1, wherein said common feedback circuit provides feedback control for said two current sources in response to comparison between said intermediate voltage and a given reference voltage, and wherein said common feedback circuit comprises:

a first differential amplifier circuit comprising a first active load and a first input stage, receiving said intermediate voltage and said reference voltage; and a second differential amplifier circuit comprising a second active load and a second input stage, receiving said intermediate voltage and said reference voltage.

20. A differential signal driver circuit, comprising:

a driver circuit responsive to differential input signals for generating differential output signals from operation currents fed from two current sources; and a common feedback circuit controlling said two current sources to regulate current levels of said operation currents in response to said differential output signals, wherein drains of a first transistor of a first conductivity type and a second transistor of a second conductivity type, different from said first conductivity type, receive an intermediate voltage of said differential output signals, wherein said common feedback circuit provides feedback control for said two current sources in response to comparison between said intermediate voltage and an exclusive given reference voltage, and wherein said common feedback circuit comprises:

a first differential amplifier circuit comprising a first active load and a first input stage, receiving said intermediate voltage and said reference voltage; and a second differential amplifier circuit comprising a second active load and a second input stage, receiving said intermediate voltage and said reference voltage.

* * * * *